United States Patent
Li et al.

(10) Patent No.: US 11,750,230 B1
(45) Date of Patent: Sep. 5, 2023

(54) DIFFERENTIAL MILLIMETER WAVE COMMUNICATION ARCHITECTURE AND ELECTRONIC DEVICE

(71) Applicant: DECO SEMICONDUCTOR (SHENZHEN) CO., LIMITED, Guangdong (CN)

(72) Inventors: Cheng Li, Guangdong (CN); Wenxue Jin, Guangdong (CN)

(73) Assignee: DECO SEMICONDUCTOR (SHENZHEN) CO., LIMITED, Shenzhen (CN)

( * ) Notice: Subject to any disclaimer, the term of this patent is extended or adjusted under 35 U.S.C. 154(b) by 0 days.

(21) Appl. No.: 18/046,502

(22) Filed: Oct. 13, 2022

Related U.S. Application Data

(63) Continuation of application No. PCT/CN2022/094384, filed on May 23, 2022.

(30) Foreign Application Priority Data

Apr. 21, 2022 (CN) .......................... 202210424018.9

(51) Int. Cl.
*H03F 9/00* (2006.01)
*H04B 1/04* (2006.01)
(Continued)

(52) U.S. Cl.
CPC .......... *H04B 1/0475* (2013.01); *H03B 19/00* (2013.01); *H03F 1/0205* (2013.01); *H04B 2001/0408* (2013.01)

(58) Field of Classification Search
CPC .................................... H03F 3/45; H03F 9/00
(Continued)

(56) References Cited

U.S. PATENT DOCUMENTS 3,310,667 A * 3/1967 Offner ...................... G06G 7/16
708/840
4,148,013 A * 4/1979 Finn ......................... G01B 7/31
33/655
(Continued)

FOREIGN PATENT DOCUMENTS

CN 111934629 A 11/2020
CN 113328712 A 8/2021

OTHER PUBLICATIONS

Jan. 17, 2023 International Search Report issued in International Patent Application No. PCT/CN2022/094384.
(Continued)

*Primary Examiner* — Henry Choe

(57) ABSTRACT

The present invention discloses a differential millimeter wave communication architecture and an electronic device, comprising a transmission apparatus, wherein the transmission apparatus comprises an oscillator, a frequency multiplier, a first differential transformer, at least one driving amplification circuit and a power amplification circuit which are connected in sequence; the driving amplification circuit comprises a driving amplifier and a second differential transformer connected in sequence; the power amplification circuit comprises a power amplifier and a third differential transformer connected in sequence; and the power amplifier comprises a signal switch connected to an on-off keying signal input end. The present invention can achieve a millimeter wave front-end circuit with low power consumption and small area.

14 Claims, 6 Drawing Sheets

(51) Int. Cl.
*H03F 1/02* (2006.01)
*H03B 19/00* (2006.01)

(58) Field of Classification Search
USPC .................................. 330/165, 252, 69, 276
See application file for complete search history.

(56) References Cited

U.S. PATENT DOCUMENTS

| | | | |
|---|---|---|---|
| 8,971,831 B2 * | 3/2015 | Vidojkovic | H04B 1/18 455/280 |
| 10,116,290 B1 | 10/2018 | Wang et al. | |
| 2017/0237469 A1 | 8/2017 | Taghivand et al. | |

OTHER PUBLICATIONS

Nov. 22, 2022 Office Action issued in Taiwanese Patent Application No. 111131825.

* cited by examiner

DIFFERENTIAL MILLIMETER WAVE COMMUNICATION ARCHITECTURE AND ELECTRONIC DEVICE

CROSS REFERENCE TO RELATED APPLICATIONS

The present application is a Continuation Application of PCT Application No. PCT/CN2022/094384 filed on May 23, 2022, which claims the benefit of Chinese Patent Application No. 202210424018.9 filed on Apr. 21, 2022. All the above are hereby incorporated by reference in their entirety.

TECHNICAL FIELD

The present invention relates to the field of wireless communications, and more particularly, to a differential millimeter wave communication architecture and an electronic device for commercial wireless application.

BACKGROUND FIELD

Traditional superheterodyne modulated RF front end is widely used in cellular phones, Wi-Fi devices, Bluetooth devices and other products. As shown in FIG. 1, it is necessary to have the LO (Local oscillator) fundamental frequency with the PLL (Phase locked loop) for modulating the signal to the carrier frequency; and signal will be transmitted and received by amplifiers. The RF front end includes several essential building blocks, for example, the LO circuit, the MIXER, the transmitter TX, the receiver RX and the digital-to-analog conversion circuit. In addition, it also needs corresponding baseband BASEBAND, (for example, the Wi-Fi device requires MAC and PHY layers) and high selectivity filter (for example, the surface acoustic wave filter SAW FILTER of a mobile phone); which will increase the complexity, power consumption, and cost of front end circuit.

The millimeter wave band (30-300 GHz) has the natural advantage of high bandwidth. Due to the significant oxygen attenuation at 60 GHz, the millimeter wave signal will not cause interference to the existing wireless standard. Moreover, 60GHz is an unlicensed band, no need for extra fee for permitted license. Based on this, the millimeter wave is particularly suitable for short-range and high data volume communication product.

SUMMARY OF THE INVENTION

A compact, low power and small chip area differential millimeter wave communication architecture and electronic device is presented in the invention. This transceiver utilizes OOK (ON-OFF Key) modulation; the OOK modulation relies on ON and OFF amplitude and doesn't sensitive to phase noise and accurate carrier signal frequency. Moreover, an envelope detector can be used for de-modulated signal since there is no need for a synthesized LO signal. Therefore, No PLL is required for both transmitter and receiver compared with traditional architecture to further reduce power consumption and chip area.

In order to solve the above technical problem, the technical solution adopted by the present invention is that a differential millimeter wave communication architecture comprises a transmission apparatus, wherein the transmission apparatus comprises an oscillator, a frequency multiplier, a first differential transformer, at least one driving amplification circuit and a power amplification circuit which are connected in sequence; the driving amplification circuit comprises a driving amplifier and a second differential transformer connected in sequence; the power amplification circuit comprises a power amplifier and a third differential transformer connected in sequence; and the power amplifier comprises a signal switch connected to an on-off keying signal input end.

The present invention also provides an electronic device including the differential millimeter wave communication architecture as described above.

The advantageous effect of the present invention is that by outputting the baseband signal via the oscillator and then frequency multiplication of the baseband signal to the millimeter wave frequency band via the frequency multiplier, the design difficulty of the oscillator can be reduced, and the wireless communication of short distance and high data volume can be realized. The harmonics generated by the frequency multiplier and un-desired harmonics are canceled by the first differential transformer, which also provides high-frequency impedance conversion. The signal switch of the power amplifier is controlled by the OOK signal, so as to achieve the effect of modulation. By taking advantage of the inherent high bandwidth of millimeter wave and at the same time using the OOK modulation technology to realize short-distance channel communication, the present invention can greatly simplify the overall millimeter wave front-end circuit, so as to achieve the characteristics of low power consumption and small area.

Figure 1:
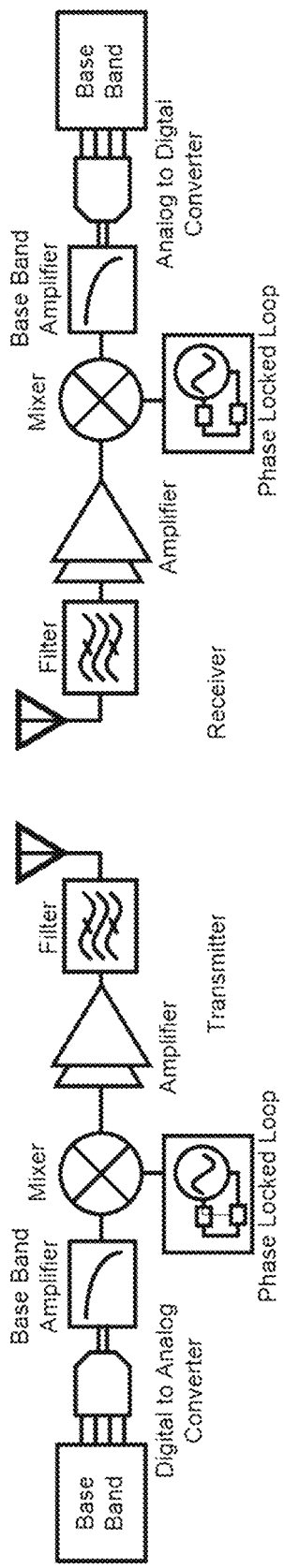
FIG. 1 is a schematic diagram of a superheterodyne amplitude modulation receiving circuit in the prior art.

DESCRIPTION OF REFERENCE NUMERALS:

100, transmission apparatus; 200, receiving apparatus;
101, oscillator; 102, frequency multiplier; 103, first differential transformer; 104, driving amplifier; 105, second differential transformer; 106, power amplifier; 107, third differential transformer;
201, fourth differential transformer; 202, low noise amplifier; 203, fifth differential transformer; 204, differential peak detector.

DETAILED DESCRIPTION OF THE INVENTION

In order to explain the technical contents, the objects, and the effects of the present invention in detail, the following description is made in conjunction with the embodiments and the accompanying drawings.

Definitions:

Oscillator is an electronic element used to generate repetitive electronic signals (generally in a sine wave or square wave), or electronic circuits or devices which can convert direct current into alternating current electrical signal output with certain frequency. Briefly, it is a frequency source commonly used in the phase locked loop (PLL).

Bandstop filter (BSF) refers to a filter through which most frequency components transmit, but attenuates some range of frequency components to very low levels, as opposed to the concept of a bandpass filter.

Harmonic refers to a signal having a frequency higher than the main signal frequency (i.e., fundamental frequency).

Odd harmonic: when the frequency of the harmonic signal is an odd multiple of the frequency of the baseband signal, the harmonic is an odd harmonic, i.e. a harmonic of which rated frequency is an odd multiple of the fundamental frequency.

Even harmonic is a harmonic with the rated frequency being an even multiple of the fundamental frequency.

Envelope detector is an envelope detector. Envelope detection is amplitude detection. By connecting the peak points of a high-frequency signal over a period of time, it is possible to obtain an upper (positive) line and a lower (negative) line, which are called envelope lines. The envelope line is a curve reflecting the amplitude variation of the high frequency signal.

OOK (on-off key) modulation technique, also known as binary amplitude keying (2ASK), controls the turning on and off of a sinusoidal carrier by a unipolar non-return-to-zero code sequence. OOK is a special case of ASK (amplitude shift keying) modulation, whose principle is to take one amplitude as zero and the other as non-zero.

Figure 2:
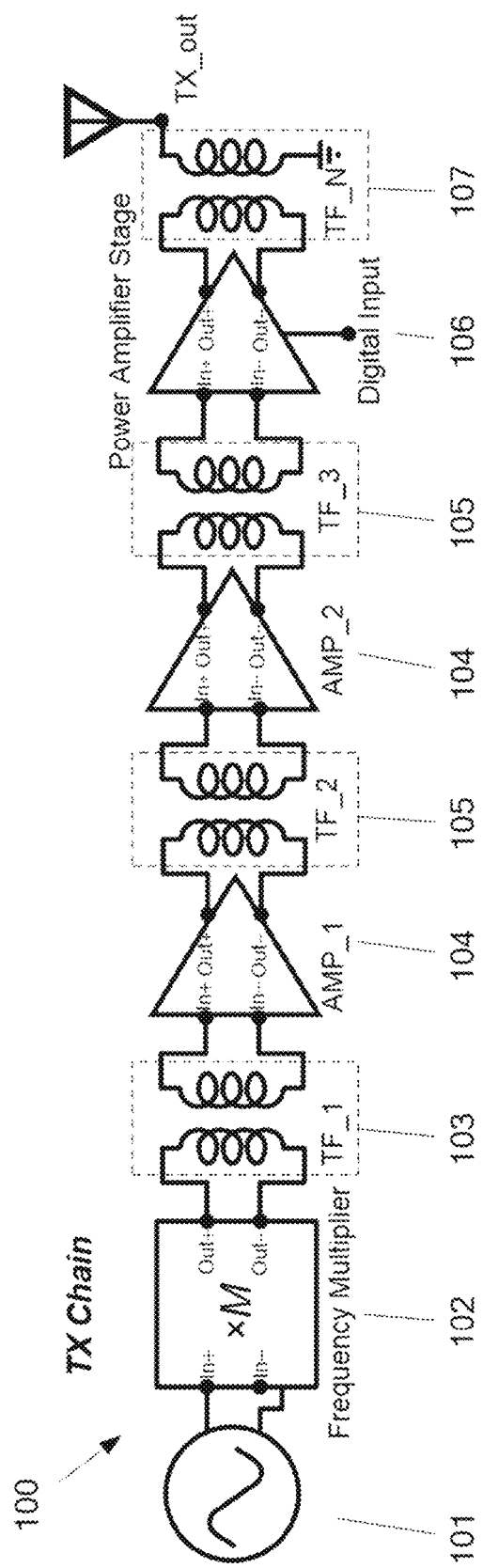
FIG. 2 is a structurally schematic diagram of a transmission apparatus according to a first embodiment of the present invention.

With reference to FIG. 2, a differential millimeter wave communication architecture includes a transmission apparatus, wherein the transmission apparatus includes an oscillator, a frequency multiplier, a first differential transformer, at least one driving amplification circuit and a power amplification circuit which are connected in sequence; the driving amplification circuit includes a driving amplifier and a second differential transformer connected in sequence; the power amplification circuit includes a power amplifier and a third differential transformer connected in sequence; and the power amplifier includes a signal switch connected to an on-off keying signal input end.

As apparent from the above description, the present invention has an advantageous effect in that it can achieve a millimeter wave front-end circuit with low power consumption and small area.

Further, the signal switch is connected to a virtual ground node.

It can be seen from the above-mentioned description that by adopting a differential circuit design, the signal switch of the power amplifier is virtual grounded in the differential circuit, so that the common mode noise caused by the switching of the signal switch can be canceled in the differential circuit, and the noise can be avoided to interfere with the front-end circuit characteristics.

Further, a positive electrode signal output end of the oscillator is connected to a positive electrode signal input end of the frequency multiplier, and a negative electrode signal output end of the oscillator is connected to a negative electrode signal input end of the frequency multiplier;

a positive electrode signal output end of the frequency multiplier is connected to one end of a primary coil of the first differential transformer, and a negative electrode signal output end of the frequency multiplier is connected to the other end of the primary coil of the first differential transformer;

one end of the secondary coil of the first differential transformer is connected to a positive electrode signal input end of the driving amplifier in a first driving amplification circuit, and the other end of the secondary coil of the first differential transformer is connected to a negative electrode signal input end of the driving amplifier in the first driving amplification circuit;

a positive electrode signal output end of the driving amplifier is connected to one end of a primary coil of the second differential transformer, and a negative electrode signal output end of the driving amplifier is connected to the other end of the primary coil of the second differential transformer;

one end of the secondary coil of the second differential transformer is connected to a positive electrode signal input end of a driving amplifier in a next driving amplification circuit, and the other end of the secondary coil of the second differential transformer is connected to a negative electrode signal input end of the driving amplifier in the next driving amplification circuit;

one end of a secondary coil of a second differential transformer in a last driving amplification circuit is connected to the positive electrode signal input end of the power amplifier, and the other end of the secondary coil of the second differential transformer in the last driving amplification circuit is connected to the negative electrode signal input end of the power amplifier;

the positive electrode signal output end of the power amplifier is connected to one end of a primary coil of the third differential transformer, and the negative electrode signal output end of the power amplifier is connected to the other end of the primary coil of the third differential transformer;

one end of the secondary coil of the third differential transformer is connected to a transmission end of the transmission apparatus, and the other end of the secondary coil of the third differential transformer is grounded.

Further, the frequency multiplier includes a first nonlinear element, a second nonlinear element, and a bandstop filter; a gate electrode of the first nonlinear element is connected to a positive electrode signal input end of the frequency multiplier, a drain electrode of the first nonlinear element is respectively connected to a positive electrode signal output end and one end of the bandstop filter, and a source electrode of the first nonlinear element is grounded; a gate electrode of the second nonlinear element is connected to a negative electrode signal input end of the frequency multiplier, a drain electrode of the second nonlinear element is respectively connected to a negative electrode signal output end of the frequency multiplier and the other end of the bandstop filter, and a source electrode of the second nonlinear element is grounded.

It can be seen from the above-mentioned description that after receiving the baseband signal generated by the oscillator, the frequency multiplier generates odd harmonics and an even harmonics by the first nonlinear element and the first nonlinear element. The odd harmonics of a preset multiple is filtered by the bandstop filter, the even harmonics is canceled by the first differential transformer, and the remaining odd harmonics can be output to the amplification circuit for frequency multiplication.

Further, the first nonlinear element and the second nonlinear element are bipolar junction transistors, heterojunction bipolar transistors, or field effect transistors.

Further, the power amplifier includes a first active device, a second active device and a signal switch, and the signal switch is a switch tube; a gate electrode of the first active device is connected to a positive electrode signal input end of the power amplifier, and a drain electrode of the first active device is connected to a positive electrode signal output end of the power amplifier; a gate electrode of the second active device is connected to a negative electrode signal input end of the power amplifier, and a drain electrode of the second active device is connected to a negative electrode signal output end of the power amplifier; a source electrode of the first active device and a source electrode of the second active device are respectively connected to a drain electrode of the switch tube; a gate electrode of the switch tube is connected to an on-off keying signal input end, and a source electrode thereof is grounded; and the source electrode of the switch tube is connected to a virtual ground node.

It can be seen from the above-mentioned description that the first active device and the second active device are power amplifier devices. An on-off keying signal can be input at the on-off keying signal input end to control the switching switch tube. The noise and non-ideal effects caused by the switch tube are suppressed because of virtual ground, without causing a loss of circuit characteristics. After the output end of the power amplifier performs signal mixing for the input end and the on-off keying, the third differential transformer synthesizes the OOK signal at the transmission end.

Further, the electronic device further includes a receiving apparatus, wherein the receiving apparatus includes a fourth differential transformer, a low noise amplifier, a fifth differential transformer and a differential peak detector which are connected in sequence; and the fifth differential transformer includes a primary coil and two secondary coils.

It can be seen from the above-mentioned description that after receiving a signal via an antenna, a receiving end firstly suppresses noise via the fourth differential transformer, then amplifies the signal via the low noise amplifier, then generates two groups of differential signals via the fifth differential transformer, and finally reverts into a digital signal via the differential peak detector.

Further, one end of a primary coil of the fourth differential transformer is connected to a receiving end of the receiving apparatus, and the other end of the primary coil of the fourth differential transformer is grounded; one end of a secondary coil of the fourth differential transformer is connected to a positive electrode signal input end of the low noise amplifier, and the other end of the secondary coil of the fourth differential transformer is connected to a negative electrode signal input end of the low noise amplifier;

a positive electrode signal output end of the low noise amplifier is connected to one end of a primary coil of the fifth differential transformer, and a negative electrode signal output end of the low noise amplifier is connected to the other end of the primary coil of the fifth differential transformer; one end of a first secondary coil of the fifth differential transformer is connected to a first positive electrode signal input end of the differential peak detector, and the other end of the first secondary coil of the fifth differential transformer is connected to a first negative electrode signal input end of the differential peak detector; and one end of a second secondary coil of the fifth differential transformer is connected to a second positive electrode signal input end of the differential peak detector, and the other end of the second secondary coil of the fifth differential transformer is connected to a second negative electrode signal input end of the differential peak detector.

Further, the differential peak detector includes a first diode, a second diode, a third nonlinear element, and a fourth nonlinear element;

one end of the first diode is connected to a first positive electrode signal input end of the differential peak detector, and the other end of the first diode is grounded; one end of the second diode is connected to a second negative electrode signal input end of the differential peak detector, and the other end of the second diode is grounded;

a gate electrode of the third nonlinear element is connected to a first positive electrode signal input end of the differential peak detector, a source electrode of the third nonlinear element is connected to a first negative electrode signal input end of the differential peak detector, and a drain electrode of the third nonlinear element is connected to a signal output end of the differential peak detector; and a gate electrode of the fourth nonlinear element is connected to a second negative electrode signal input end of the differential peak detector, a source electrode of the fourth nonlinear element is connected to a second positive electrode signal input end of the differential peak detector, and a drain electrode of the fourth nonlinear element is connected to a signal output end of the differential peak detector.

It can be seen from the above-mentioned description that the positive amplitude is demodulated by the third nonlinear element and the first diode, the negative amplitude is demodulated by the fourth nonlinear element and the second diode, and finally the signal output is superimposed on the signal output end, so that the positive amplitude and the negative amplitude demodulation can be fully utilized.

The present invention also provides an electronic device including the differential millimeter wave communication architecture as described above.

First Embodiment

With reference to FIGS. 2-9, according to the first embodiment of the present invention, a differential communication architecture can be applied to a mobile terminal, a WiFi device or a Bluetooth device for wireless communication with short distance and high data volume, the communication architecture including a transmission apparatus and a receiving apparatus connected in wireless communication.

As shown in FIG. 2, the transmission apparatus (TX Chain) 100 includes an oscillator 101, a frequency multiplier 102, a first differential transformer (TF_1) 103, at least one driving amplification circuit and power amplification circuit connected in sequence. Herein, the driving amplification circuit includes a driving amplifier 104 and a second differential transformer 105 connected in sequence. The power amplification circuit includes a power amplifier (Power amplifier stage) 106 and a third differential transformer (TFN) 107 connected in sequence. In the present embodiment, an example is described in which two driving amplification circuits are included. AMP_1 and TF_2 are the first driving amplification circuits, and AMP_2 and TF_3 are the second driving amplification circuits. In a preferred embodiment, the number of driving amplification circuits is four. In other embodiments, the number of driving amplification circuits may be other numbers.

Specifically, a positive electrode signal output end of the oscillator 101 is connected to a positive electrode signal input end In+ of the frequency multiplier 102, and a negative electrode signal output end of the oscillator 101 is connected to a negative electrode signal input end In− of the frequency multiplier 102. A positive electrode signal output end Out+ of the frequency multiplier 102 is connected to one end of a primary coil of the first differential transformer 103, and a negative electrode signal output end Out− of the frequency multiplier 102 is connected to the other end of the primary coil of the first differential transformer 103. One end of a secondary coil of the first differential transformer 103 is connected to a positive electrode signal input end In+ of the driving amplifier (AMP_1) 104 in the first driving amplification circuit, and the other end of the secondary coil of the first differential transformer 103 is connected to a negative electrode signal input end In− of the driving amplifier 104 in the first driving amplification circuit.

With regard to other driving amplification circuits except the last driving amplification circuit, a positive electrode signal output end Out+ of the driving amplifier 104 is connected to one end of a primary coil of the second differential transformer 105, and a negative electrode signal output end Out− of the driving amplifier 104 is connected to the other end of the primary coil of the second differential transformer 105. One end of a secondary coil of the second differential transformer 105 is connected to a positive electrode signal input end In+ of the driving amplifier 104 in a next driving amplification circuit, and the other end of the secondary coil of the second differential transformer 105 is connected to the negative electrode signal input end In− of the driving amplifier 104 in the next driving amplification circuit.

One end of a secondary coil of the second differential transformer 105 in the last driving amplification circuit is connected to a positive electrode signal input end In+ of the power amplifier 106, and the other end of the secondary coil of the second differential transformer 105 in the last driving amplification circuit is connected to a negative electrode signal input end In− of the power amplifier 106. A positive electrode signal output end Out+ of the power amplifier 106 is connected to one end of a primary coil of the third differential transformer 107, and a negative electrode signal output end Out− of the power amplifier 106 is connected to the other end of the primary coil of the third differential transformer 107. The power amplifier 106 is further connected to an on-off keying signal input end, a digital input.

One end of a secondary coil of the third differential transformer 107 is connected to the transmission end TX_out of the transmission apparatus 100, and the other end of the secondary coil of the third differential transformer 107 is grounded.

Figure 3:
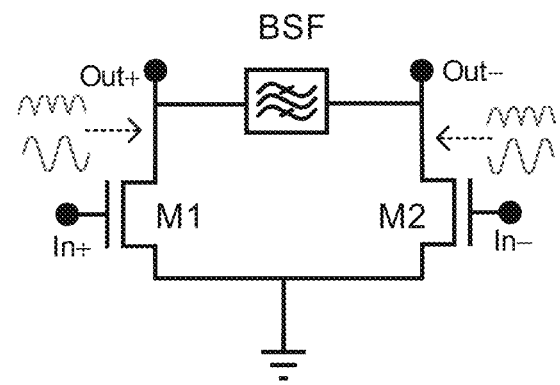
FIG. 3 is a structurally schematic diagram of a frequency multiplier according to the first embodiment of the present invention.

Further, as shown in FIG. 3, the frequency multiplier includes a first nonlinear element M1, a second nonlinear element M2 and a bandstop filter BSF. A gate electrode (gate) of the first nonlinear element M1 is connected to a positive electrode signal input end In+ of the frequency multiplier, a drain electrode (drain) is respectively connected to a positive electrode signal output end Out+ and one end of the bandstop filter BSF, and a source electrode (source) is grounded. A gate of the second nonlinear element M2 is connected to a negative electrode signal input end In− of the frequency multiplier, a drain electrode is connected to the negative electrode signal output end Out− of the frequency multiplier and the other end of the bandstop filter BSF, respectively, and a source electrode is grounded.

In this embodiment, the first nonlinear element M1 and the second nonlinear element M2 are bipolar junction transistors (BJTs), heterojunction bipolar transistors (HBTs) or field effect transistors (FETs), the field effect transistors (FETs) comprise junction field effect transistors (JFETs) and metal-oxide semiconductor field effect transistors (MOS-FETs).

In the transmission apparatus, an oscillator is used to generate a baseband signal, and a frequency multiplier is used to multiply the baseband signal by M to a millimeter wave frequency band. The length of the primary coil of the first differential transformer is M times the length of the secondary coil thereof. The primary coil of the first differential transformer matches the frequency of the baseband signal and the secondary coil matches M times of the frequency of the baseband signal. In this embodiment, the frequency of the baseband signal generated by the oscillator is 20 GHz, M=3, i.e., frequency-multiplied to 60 GHz. The primary coil of the first differential transformer achieves an impedance match of 20 GHz and the secondary coil achieves an impedance match of 60 GHz.

Specifically, the positive electrode signal input end In+ and the negative electrode signal input end In− of the frequency multiplier receive the baseband signal generated by the oscillator and generate odd harmonics (out of phase with the baseband signal) and even harmonics (in phase with the baseband signal) by the first nonlinear element M1 and the second nonlinear element M2.

Since the transformer is differential (reverse addition) and the even harmonics are in phase with the baseband signal, the even harmonics will be canceled by the first differential transformer TF_1. At the same time, the stop band range of the bandstop filter is designed to be a preset odd multiple of the frequency of the baseband signal. Therefore, the bandstop filter will filter out odd harmonics of the preset odd multiple frequency, and the remaining odd harmonics can be output to the amplification circuit for frequency multiplication. Since the amplifier does not amplify signals having too large a frequency, only odd harmonics having a frequency that is a certain odd multiple of the frequency of the baseband signal are amplified.

In this embodiment, the stop band range of the bandstop filter is designed at the frequency of the odd harmonics with the minimum frequency, i.e., 1 times of the frequency of the baseband signal, which is also the frequency of the baseband signal generated by the oscillator. Therefore, the bandstop filter will filter out the odd harmonics with the frequency of 1 times of the frequency of the baseband signal, and the odd harmonics with the frequency of other odd multiples of the frequency of the baseband signal will be output to the amplification circuit for amplification. Also, in this embodiment, the amplifier amplifies only odd harmonics having a frequency that is three times the frequency of the baseband signal.

Figure 4:
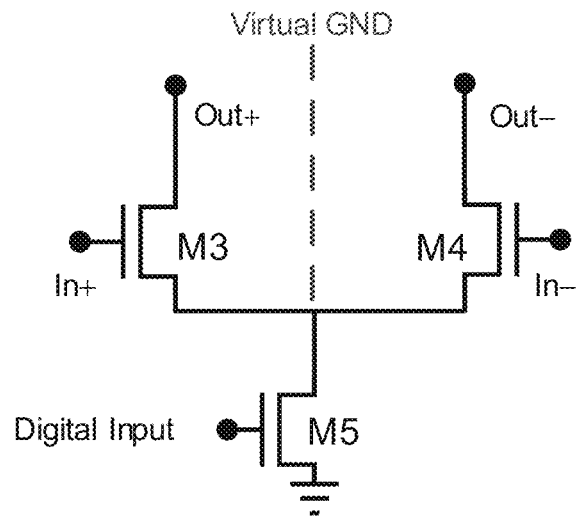
FIG. 4 is a structurally schematic diagram of a power amplifier according to the first embodiment of the present invention.

Further, as shown in FIG. 4, the power amplifier includes a first active device M3, a second active device M4, and a signal switch connected to a virtual ground node. In this embodiment, the signal switch is a (digital signal) switch tube (SWT) M5. A gate electrode of the first active device M3 is connected to a positive electrode signal input end In+ of the power amplifier, and a drain electrode is connected to a positive electrode signal output end Out+ of the power amplifier. A gate electrode of the second active device M4 is connected to a negative electrode signal input end In− of the power amplifier, and a drain electrode is connected to a negative electrode signal output end Out− of the power amplifier. A drain electrode of the switch tube M5 is respectively connected to a source electrode of the first active device M3 and a source electrode of the second active device M4, a gate electrode is connected to an on-off keying signal input end, a Digital input, and a source electrode is grounded. Meanwhile, the drain electrode of the switch tube M5 is equivalent to virtual ground. When the signal switch M5 is switched, the virtual ground does not affect the circuit.

In this embodiment, the first active device M3 and the second active device M4 are used for amplifying a signal to amplify a millimeter wave signal to a preset index. In this embodiment, the first active device M3 and the second active device M4 may be bipolar junction transistors (BJTs), heterojunction bipolar transistors (HBTs) or field effect transistors (FETs), the field effect transistors (FETs) comprise junction field effect transistors (JFETs) and metal-oxide semiconductor field effect transistors (MOS-FETs).

Figure 5:
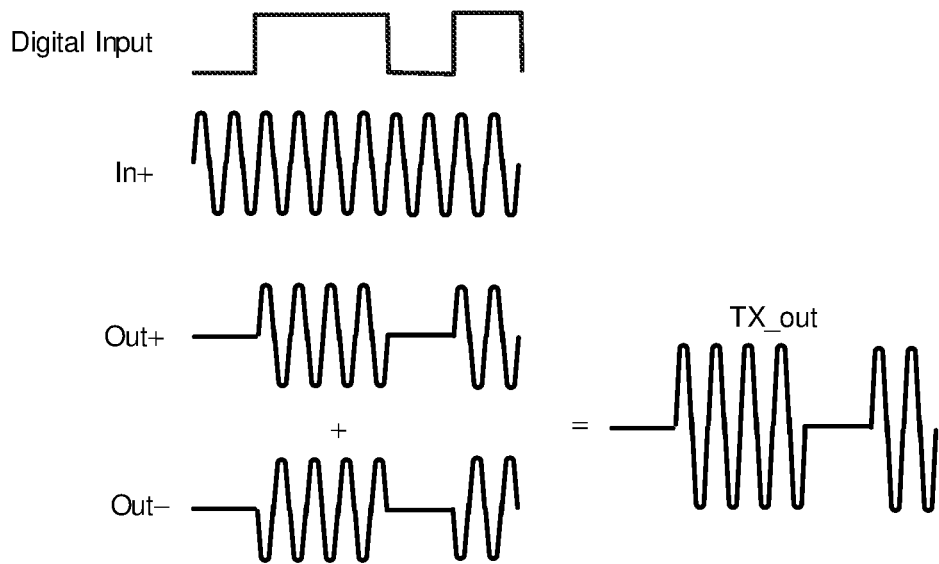
FIG. 5 is a signal waveform diagram corresponding to each port of the power amplifier according to the first embodiment of the present invention.

The signal waveforms corresponding to each port of the power amplifier and the corresponding signal waveforms at the transmission end are shown in FIG. 5, and it can be seen that the output ends Out+ and Out− of the power amplifier mix the signals input by the input ends In+ and In− thereof with the signals input by the on-off keying signal input end, and then a OOK signal is differentially synthesized at the transmission end TX_out by using the third differential transformer TF_N. Finally, the signal is transmitted by the antenna at the transmission end TX_out.

The function of the third differential transformer is the same as the function of the first differential transformer and the second differential transformer, in both cases achieving impedance matching.

Figure 6:
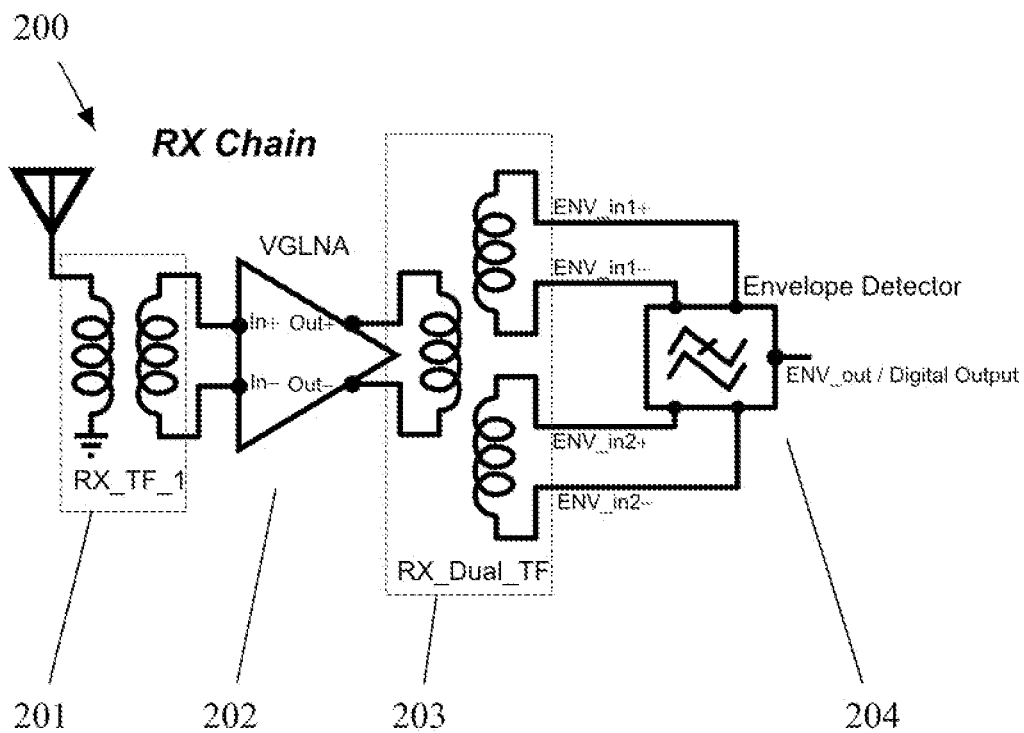
FIG. 6 is a structurally schematic diagram of a receiving apparatus according to the first embodiment of the present invention.

As shown in FIG. 6, a receiving apparatus (RX Chain) 200 includes a fourth differential transformer 201, a low noise amplifier 202, a fifth differential transformer 203, and a differential peak detector 204 which are connected in sequence. The fifth differential transformer 203 includes a primary coil and two secondary coils, and can generate two sets of differential signals according to input signals.

Specifically, one end of a primary coil of the fourth differential transformer (RX_TF_1) 201 is connected to a receiving end of the receiving apparatus 200, and the other end of the primary coil of the fourth differential transformer 201 is grounded. One end of a secondary coil of the fourth differential transformer 201 is connected to a positive electrode signal input end In+of the low noise amplifier (VGLNA) 202, and the other end of the secondary coil of the fourth differential transformer 201 is connected to a negative electrode signal input end In− of the low noise amplifier 20. A positive electrode signal output end Out+ of the low noise amplifier 202 is connected to one end of a primary coil of the fifth differential transformer (RX_Dual_TF) 203, and a negative electrode signal output end Out− of the low noise amplifier 202 is connected to the other end of the primary coil of the fifth differential transformer 203. One end of a first secondary coil of the fifth differential transformer 203 is connected to a first positive electrode signal input end ENV_in1+ of the differential peak detector (Envelope detector) 204, and the other end is connected to a first negative electrode signal input end ENV_in1− of the differential peak detector 204. One end of the second secondary coil of the fifth differential transformer 203 is connected to a second positive electrode signal input end ENV_in2+ of the differential peak detector 204, and the other end is connected to a second negative electrode signal input end ENV_in2− of the differential peak detector 204.

In a receiving apparatus, after receiving a signal via an antenna, a receiving end firstly suppresses noise via the fourth differential transformer (RX_TF_1). The signal is amplified by the low noise amplifier (VGLNA). Two sets of differential signals ENV_in1+ and ENV_in1−, and ENV_in2− and ENV_in2+ are generated by the fifth differential transformer (RX_Dual_TF). Finally, the signal is demodulated by the differential peak detector (Envelope detector) to revert into a digital signal.

Figure 7:
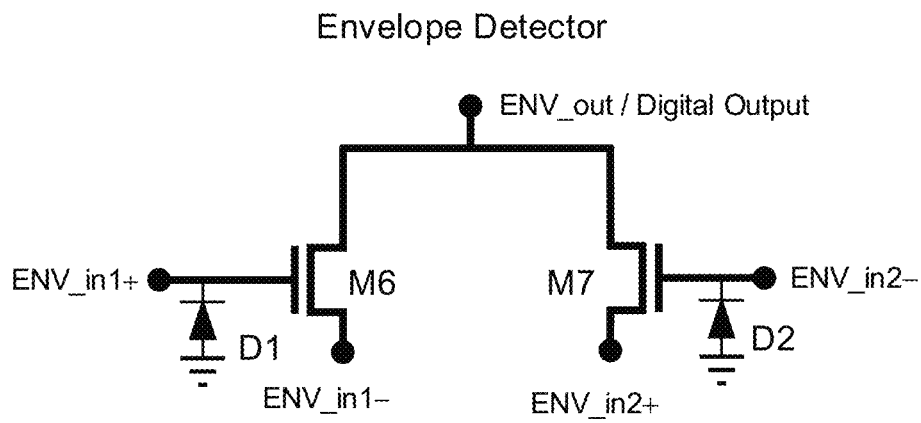
FIG. 7 is a structurally schematic diagram of a differential peak detector according to the first embodiment of the present invention.

Further, as shown in FIG. 7, the differential peak detector includes a first diode D1, a second diode D2, a third nonlinear element M6, and a fourth nonlinear element M7. One end of the first diode D1 is connected to a first positive electrode signal input end ENV_in1+ of the differential peak detector, and the other end thereof is grounded. A gate electrode of the third nonlinear element M6 is connected to a first positive electrode signal input end ENV_in1+ of the differential peak detector, a source electrode is connected to a first negative electrode signal input end ENV_in1− of the differential peak detector, and a drain electrode is connected to a signal output end ENV_out of the differential peak detector. One end of the second diode D2 is connected to a second negative electrode signal input end ENV_in2− of the differential peak detector, and the other end thereof is grounded. A gate electrode of the fourth nonlinear element M7 is connected to a second negative electrode signal input end ENV_in2− of the differential peak detector, a source electrode is connected to a second positive electrode signal input end ENV_in2+ of the differential peak detector, and a drain electrode is connected to a signal output end ENV_out of the differential peak detector.

In this embodiment, the third nonlinear element M6 and the fourth nonlinear element M7 are used to integrate the signals, add the differential signals in anti-phase, and then increase the signal amplitude, which is easier for the peak detection of the first diode D1 and the second diode D2. In this embodiment, the third nonlinear element M6 and the fourth nonlinear element M7 may be bipolar junction transistors (BJTs), heterojunction bipolar transistors (HBTs) or field effect transistors (FETs), the field effect transistors (FETs) comprise junction field effect transistors (JFETs) and metal-oxide semiconductor field effect transistors (MOS-FETs).

Figure 8:
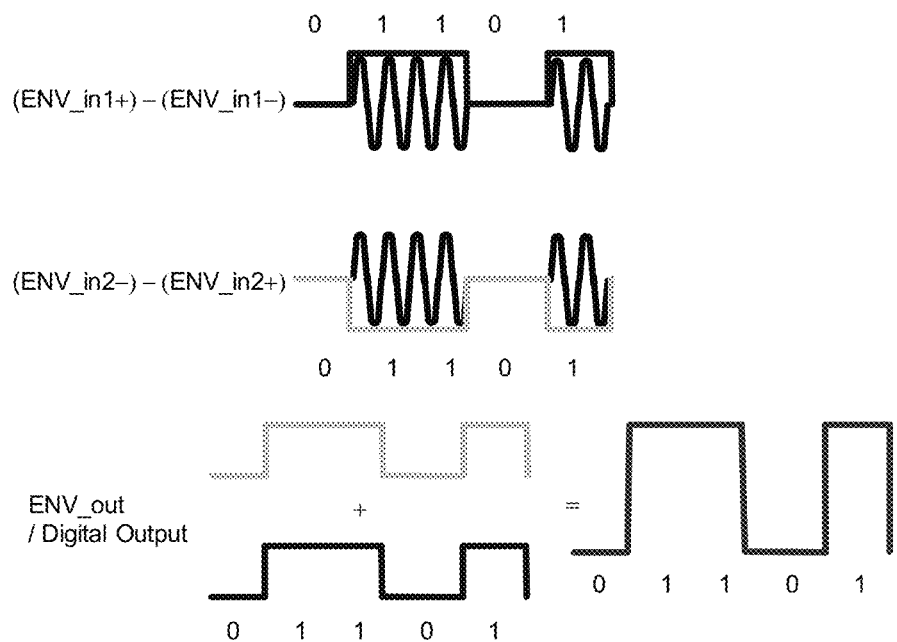
FIG. 8 is a signal waveform diagram corresponding to each port of the differential peak detector according to the first embodiment of the present invention.

The signal waveform corresponding to each port of the differential peak detector is as shown in FIG. 8. In the differential peak detector, the third nonlinear element M6 and the first diode D1 demodulate the positive amplitude of (ENV_in1+)−(ENV_in1−). The fourth nonlinear element M7 and the second diode D2 demodulate the negative amplitude of (ENV_in2−)−(ENV_in2+), and finally the signal output is superimposed at the signal output end ENV_out. The differential peak detectors make full use of positive and negative amplitude demodulation without wasting half of the energy.

Figure 9:
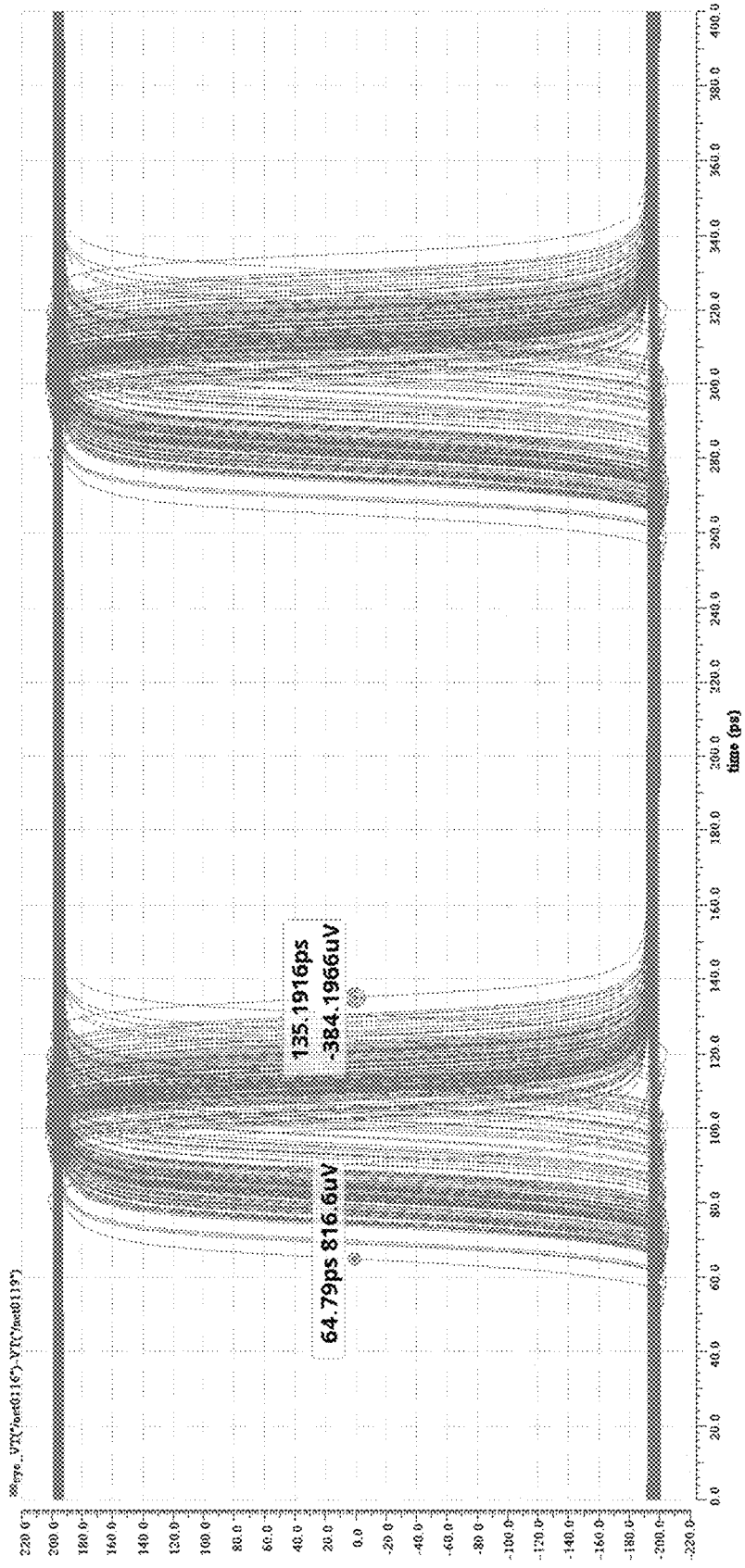
FIG. 9 is a diagram showing simulation results according to the first embodiment of the present invention.

The simulation results of this embodiment are shown in FIG. 9. The simulation includes a physical transmission apparatus TX Chain signal channel and a receiving apparatus RX Chain. It can be seen from the drawings that the OOK signal can be successfully demodulated at the RX output end.

In this embodiment, a local oscillation source generates an output signal source. The output signal drives a group of frequency multipliers to multiply the frequency of the signal to the millimeter wave band, and a digital signal (an on-off keying signal) directly drives the switch of the power amplifier to achieve the effect of modulation. Since the OOK (on-off key) modulation technology does not need to comply with commercial specifications, there is no need for the protocol layer fundamental frequency circuit (MAC layer and PHY layer). As the OOK modulation technology only needs to realize ON/OFF and the requirement for frequency accuracy is not high (the frequency of the present embodiment only needs to be at 60 GHz, and there is no need to use a standard frequency channel with such an accurate frequency as 2.4152 GHz required by WiFi), there is no need for phase-locked loop frequency locking, namely, there is no need for a PLL phase-locked loop. At the same time, since the millimeter wave frequency band itself is in a high frequency band, it is difficult to generate interference with other systems, and therefore there is no need for an additional filter to filter the interference.

Since the overall circuit adopts a differential circuit design, the signal switch of the power amplifier is in the Virtual GND of the differential circuit, so that the common mode noise (common mode noise) caused by the switching of the signal switch can be canceled in the differential circuit, i.e., the noise and non-ideal effects caused by the switch tube are suppressed by the virtual GND, without causing loss of circuit characteristics. The frequency multiplier cancel all even harmonics by using a differential circuit, extracts higher order harmonics, and uses the first differential transformer TF_1 to achieve high frequency impedance conversion. In the low noise amplifier, the common mode noise can be canceled. Differential peak detectors can detect the positive and negative amplitude of signal 1 and superpose the signal in the output to avoid loss of signal amplitude for maximum efficiency.

This embodiment takes advantage of the inherent high bandwidth of millimeter wave and uses the OOK (on-off key) modulation technology to achieve short-range channel communication, so that the overall millimeter wave front-end circuit can be greatly simplified. Compared with the existing circuit of FIG. 1, it does not need a phase-locked loop PLL and a mixer and even a digital-to-no digital-to-analog conversion circuit, and no additional filter is needed, which can achieve the features of low power consumption and small area.

In summary, the present invention provides a differential millimeter wave communication architecture and an electronic device. By outputting the baseband signal via the oscillator and then frequency multiplication of the baseband signal to the millimeter wave frequency band via the frequency multiplier, the design difficulty of the oscillator can be reduced, and the wireless communication of short distance and high data volume can be realized. The even harmonics generated by frequency multiplication of the frequency multiplier are canceled by the first differential transformer, and high-frequency impedance conversion is realized. The signal switch of the power amplifier is controlled by the on-off keying signal, so as to achieve the effect of modulation. By adopting a differential circuit design, the signal switch of the power amplifier is virtual grounded in the differential circuit, so that the common mode noise caused by the switching of the signal switch can be canceled in the differential circuit, and the noise can be avoided to interfere with the front-end circuit characteristics. The present invention can greatly simplify the overall millimeter wave front-end circuit, so as to achieve the characteristics of low power consumption and small area, and can avoid noise interference with the front-end circuit characteristics.

The above description is only the embodiments of the present invention and do not limit the patent scope of the present invention. Any equivalent transformations made using the content of the description and drawings of the present invention, or the embodiments directly or indirectly applied in related technical fields, are also included in the scope of patent protection of the present invention.

What is claimed is:

1. A differential millimeter wave communication architecture, comprising a transmission apparatus, wherein the transmission apparatus comprises an oscillator, a frequency multiplier, a first differential transformer, at least one driving amplification circuit and a power amplification circuit which are connected in sequence; the driving amplification circuit comprises a driving amplifier and a second differential transformer connected in sequence; the power amplification circuit comprises a power amplifier and a third differential transformer connected in sequence; and the power amplifier comprises a signal switch connected to an on-off keying signal input end;

wherein the signal switch is connected to a virtual ground node; and the differential millimeter wave communication architecture further comprises a receiving apparatus, wherein the receiving apparatus comprises a fourth differential transformer, a low noise amplifier, a fifth differential transformer and a differential peak detector which are connected in sequence; and the fifth differential transformer includes a primary coil and two secondary coils.

2. A differential millimeter wave communication architecture, comprising a transmission apparatus, wherein the transmission apparatus comprises an oscillator, a frequency multiplier, a first differential transformer, at least one driving amplification circuit and a power amplification circuit which are connected in sequence; the driving amplification circuit comprises a driving amplifier and a second differential transformer connected in sequence; the power amplification circuit comprises a power amplifier and a third differential transformer connected in sequence; and the power amplifier comprises a signal switch connected to an on-off keying signal input end;

wherein the signal switch is connected to a virtual ground node, wherein a positive electrode signal output end of the oscillator is connected to a positive electrode signal input end of the frequency multiplier, and a negative electrode signal output end of the oscillator is connected to a negative electrode signal input end of the frequency multiplier;

a positive electrode signal output end of the frequency multiplier is connected to one end of a primary coil of the first differential transformer, and a negative electrode signal output end of the frequency multiplier is connected to the other end of the primary coil of the first differential transformer;

one end of the secondary coil of the first differential transformer is connected to a positive electrode signal input end of the driving amplifier in a first driving amplification circuit, and the other end of the secondary coil of the first differential transformer is connected to a negative electrode signal input end of the driving amplifier in the first driving amplification circuit;

a positive electrode signal output end of the driving amplifier is connected to one end of a primary coil of the second differential transformer, and a negative electrode signal output end of the driving amplifier is connected to the other end of the primary coil of the second differential transformer;

one end of the secondary coil of the second differential transformer is connected to a positive electrode signal input end of a driving amplifier in a next driving amplification circuit, and the other end of the secondary coil of the second differential transformer is connected to a negative electrode signal input end of the driving amplifier in the next driving amplification circuit;

one end of a secondary coil of a second differential transformer in a last driving amplification circuit is connected to the positive electrode signal input end of the power amplifier, and the other end of the secondary coil of the second differential transformer in the last driving amplification circuit is connected to the negative electrode signal input end of the power amplifier;

the positive electrode signal output end of the power amplifier is connected to one end of a primary coil of the third differential transformer, and the negative electrode signal output end of the power amplifier is connected to the other end of the primary coil of the third differential transformer;

one end of the secondary coil of the third differential transformer is connected to a transmission end of the transmission apparatus, and the other end of the secondary coil of the third differential transformer is grounded.

3. The differential millimeter wave communication architecture according to claim 2, wherein the frequency multiplier comprises a first nonlinear element, a second nonlinear element, and a bandstop filter; a gate electrode of the first nonlinear element is connected to a positive electrode signal input end of the frequency multiplier, a drain electrode of the first nonlinear element is respectively connected to a positive electrode signal output end and one end of the bandstop filter, and a source electrode of the first nonlinear element is grounded; a gate electrode of the second nonlinear element is connected to a negative electrode signal input end of the frequency multiplier, a drain electrode of the second nonlinear element is respectively connected to a negative electrode signal output end of the frequency multiplier and the other end of the bandstop filter, and a source electrode of the second nonlinear element is grounded.

4. The differential millimeter wave communication architecture according to claim 3, wherein the first nonlinear element and the second nonlinear element are bipolar junction transistors, heterojunction bipolar transistors, or field effect transistors.

5. The differential millimeter wave communication architecture according to claim 2, wherein the power amplifier comprises a first active device, a second active device and a signal switch, and the signal switch is a switch tube; a gate electrode of the first active device is connected to a positive electrode signal input end of the power amplifier, and a drain electrode of the first active device is connected to a positive electrode signal output end of the power amplifier; a gate electrode of the second active device is connected to a negative electrode signal input end of the power amplifier, and a drain electrode of the second active device is connected to a negative electrode signal output end of the power amplifier; a source electrode of the first active device and a source electrode of the second active device are respectively connected to a drain electrode of the switch tube; a gate electrode of the switch tube is connected to an on-off keying signal input end, and a source electrode thereof is grounded; and the source electrode of the switch tube is connected to a virtual ground node.

6. The differential millimeter wave communication architecture according to claim 1, wherein one end of a primary coil of the fourth differential transformer is connected to a receiving end of the receiving apparatus, and the other end of the primary coil of the fourth differential transformer is grounded; one end of a secondary coil of the fourth differential transformer is connected to a positive electrode signal input end of the low noise amplifier, and the other end of the secondary coil of the fourth differential transformer is connected to a negative electrode signal input end of the low noise amplifier;

a positive electrode signal output end of the low noise amplifier is connected to one end of a primary coil of the fifth differential transformer, and a negative electrode signal output end of the low noise amplifier is connected to the other end of the primary coil of the fifth differential transformer;

one end of a first secondary coil of the fifth differential transformer is connected to a first positive electrode signal input end of the differential peak detector, and the other end of the first secondary coil of the fifth differential transformer is connected to a first negative electrode signal input end of the differential peak detector; and one end of a second secondary coil of the fifth differential transformer is connected to a second positive electrode signal input end of the differential peak detector, and the other end of the second secondary coil of the fifth differential transformer is connected to a second negative electrode signal input end of the differential peak detector.

7. The differential millimeter wave communication architecture according to claim 6, wherein the differential peak detector comprises a first diode, a second diode, a third nonlinear element, and a fourth nonlinear element;

one end of the first diode is connected to a first positive electrode signal input end of the differential peak detector, and the other end of the first diode is grounded; one end of the second diode is connected to a second negative electrode signal input end of the differential peak detector, and the other end of the second diode is grounded;

a gate electrode of the third nonlinear element is connected to a first positive electrode signal input end of the differential peak detector, a source electrode of the third nonlinear element is connected to a first negative electrode signal input end of the differential peak detector, and a drain electrode of the third nonlinear element is connected to a signal output end of the differential peak detector; and a gate electrode of the fourth nonlinear element is connected to a second negative electrode signal input end of the differential peak detector, a source electrode of the fourth nonlinear element is connected to a second positive electrode signal input end of the differential peak detector, and a drain electrode of the fourth nonlinear element is connected to a signal output end of the differential peak detector.

8. An electronic device, comprising a differential millimeter wave communication architecture, wherein the differential millimeter wave communication architecture comprises a transmission apparatus, and the transmission apparatus comprises an oscillator, a frequency multiplier, a first differential transformer, at least one driving amplification circuit and a power amplification circuit which are connected in sequence; the driving amplification circuit comprises a driving amplifier and a second differential transformer connected in sequence; the power amplification circuit comprises a power amplifier and a third differential transformer connected in sequence; and the power amplifier comprises a signal switch connected to an on-off keying signal input end;

wherein the signal switch is connected to a virtual ground node;

wherein the electronic device further comprises a receiving apparatus, wherein the receiving apparatus comprises a fourth differential transformer, a low noise amplifier, a fifth differential transformer and a differential peak detector which are connected in sequence; and the fifth differential transformer includes a primary coil and two secondary coils.

9. The electronic device according to claim 8, wherein a positive electrode signal output end of the oscillator is connected to a positive electrode signal input end of the frequency multiplier, and a negative electrode signal output end of the oscillator is connected to a negative electrode signal input end of the frequency multiplier;
  a positive electrode signal output end of the frequency multiplier is connected to one end of a primary coil of the first differential transformer, and a negative electrode signal output end of the frequency multiplier is connected to the other end of the primary coil of the first differential transformer;
  one end of the secondary coil of the first differential transformer is connected to a positive electrode signal input end of the driving amplifier in a first driving amplification circuit, and the other end of the secondary coil of the first differential transformer is connected to a negative electrode signal input end of the driving amplifier in the first driving amplification circuit;
  a positive electrode signal output end of the driving amplifier is connected to one end of a primary coil of the second differential transformer, and a negative electrode signal output end of the driving amplifier is connected to the other end of the primary coil of the second differential transformer;
  one end of the secondary coil of the second differential transformer is connected to a positive electrode signal input end of a driving amplifier in a next driving amplification circuit, and the other end of the secondary coil of the second differential transformer is connected to a negative electrode signal input end of the driving amplifier in the next driving amplification circuit;
  one end of a secondary coil of a second differential transformer in a last driving amplification circuit is connected to the positive electrode signal input end of the power amplifier, and the other end of the secondary coil of the second differential transformer in the last driving amplification circuit is connected to the negative electrode signal input end of the power amplifier;
  the positive electrode signal output end of the power amplifier is connected to one end of a primary coil of the third differential transformer, and the negative electrode signal output end of the power amplifier is connected to the other end of the primary coil of the third differential transformer;
  one end of the secondary coil of the third differential transformer is connected to a transmission end of the transmission apparatus, and the other end of the secondary coil of the third differential transformer is grounded.

10. The electronic device according to claim 9, wherein the frequency multiplier comprises a first nonlinear element, a second nonlinear element, and a bandstop filter; a gate electrode of the first nonlinear element is connected to a positive electrode signal input end of the frequency multiplier, a drain electrode of the first nonlinear element is respectively connected to a positive electrode signal output end and one end of the bandstop filter, and a source electrode of the first nonlinear element is grounded; a gate electrode of the second nonlinear element is connected to a negative electrode signal input end of the frequency multiplier, a drain electrode of the second nonlinear element is respectively connected to a negative electrode signal output end of the frequency multiplier and the other end of the bandstop filter, and a source electrode of the second nonlinear element is grounded.

11. The electronic device according to claim 10, wherein the first nonlinear element and the second nonlinear element are bipolar junction transistors, heterojunction bipolar transistors, or field effect transistors.

12. The electronic device according to claim 9, wherein the power amplifier comprises a first active device, a second active device and a signal switch, and the signal switch is a switch tube; a gate electrode of the first active device is connected to a positive electrode signal input end of the power amplifier, and a drain electrode of the first active device is connected to a positive electrode signal output end of the power amplifier; a gate electrode of the second active device is connected to a negative electrode signal input end of the power amplifier, and a drain electrode of the second active device is connected to a negative electrode signal output end of the power amplifier; a source electrode of the first active device and a source electrode of the second active device are respectively connected to a drain electrode of the switch tube; a gate electrode of the switch tube is connected to an on-off keying signal input end, and a source electrode thereof is grounded; and the source electrode of the switch tube is connected to a virtual ground node.

13. The electronic device according to claimer 8, wherein one end of a primary coil of the fourth differential transformer is connected to a receiving end of the receiving apparatus, and the other end of the primary coil of the fourth differential transformer is grounded; one end of a secondary coil of the fourth differential transformer is connected to a positive electrode signal input end of the low noise amplifier, and the other end of the secondary coil of the fourth differential transformer is connected to a negative electrode signal input end of the low noise amplifier;
  a positive electrode signal output end of the low noise amplifier is connected to one end of a primary coil of the fifth differential transformer, and a negative electrode signal output end of the low noise amplifier is connected to the other end of the primary coil of the fifth differential transformer;
  one end of a first secondary coil of the fifth differential transformer is connected to a first positive electrode signal input end of the differential peak detector, and the other end of the first secondary coil of the fifth differential transformer is connected to a first negative electrode signal input end of the differential peak detector; and one end of a second secondary coil of the fifth differential transformer is connected to a second positive electrode signal input end of the differential peak detector, and the other end of the second secondary coil of the fifth differential transformer is connected to a second negative electrode signal input end of the differential peak detector.

14. The electronic device according to claim 13, wherein the differential peak detector comprises a first diode, a second diode, a third nonlinear element, and a fourth nonlinear element;
  one end of the first diode is connected to a first positive electrode signal input end of the differential peak detector, and the other end of the first diode is grounded; one end of the second diode is connected to a second negative electrode signal input end of the differential peak detector, and the other end of the second diode is grounded;

a gate electrode of the third nonlinear element is connected to a first positive electrode signal input end of the differential peak detector, a source electrode of the third nonlinear element is connected to a first negative electrode signal input end of the differential peak detector, and a drain electrode of the third nonlinear element is connected to a signal output end of the differential peak detector; and a gate electrode of the fourth nonlinear element is connected to a second negative electrode signal input end of the differential peak detector, a source electrode of the fourth nonlinear element is connected to a second positive electrode signal input end of the differential peak detector, and a drain electrode of the fourth nonlinear element is connected to a signal output end of the differential peak detector.

* * * * *